United States Patent [19]

Hamaguchi et al.

[11] 3,970,933

[45] July 20, 1976

[54] DEVICE FOR CHECKING A D.C. SOURCE VOLTAGE RELATIVE TO A PREDETERMINED VALUE

[75] Inventors: Ichiro Hamaguchi, Yokohama; Kenji Toyoda, Kawasaki, both of Japan

[73] Assignee: Nippon Kogaku K.K., Tokyo, Japan

[22] Filed: Jan. 20, 1975

[21] Appl. No.: 542,542

[52] U.S. Cl. ............................ 324/133; 324/29.5; 340/249
[51] Int. Cl.² .................. G01R 19/16; G01N 27/46
[58] Field of Search .................. 324/29.5, 131–133; 340/248 A, 248 B, 248 C, 249

[56] References Cited
UNITED STATES PATENTS

| | | | |
|---|---|---|---|
| 2,482,980 | 9/1949 | Kallmann | 250/209 |
| 2,922,104 | 1/1960 | Godshalk et al. | 324/29.5 |
| 3,068,410 | 12/1962 | Galman | 324/131 |
| 3,118,137 | 1/1964 | Vincent | 324/29.5 X |
| 3,204,193 | 8/1965 | Rhyne | 340/249 X |
| 3,256,475 | 6/1966 | Kelly | 324/133 X |
| 3,263,170 | 7/1966 | Schneider | 324/132 X |
| 3,452,347 | 6/1969 | Stimson | 324/133 X |
| 3,789,242 | 1/1974 | Cantor | 340/248 B X |

*Primary Examiner*—Gerard R. Strecker
*Attorney, Agent, or Firm*—Fitzpatrick, Cella, Harper & Scinto

[57] ABSTRACT

A device for testing the voltage of a voltage source comprises a bridge circuit, a differential switching circuit and an indicator element. The bridge circuit includes a first circuit comprising a first resistor; a second circuit comprising first diode means connected to the first circuit; a third circuit comprising a second resistor connected to the first circuit, the junction between the third and first circuits being connected to one terminal of the voltage source; and a fourth circuit comprising a serial connection of second diode means and a third resistor. One end of the fourth circuit is connected to the third circuit and the other end is connected to the second circuit. The junction between the fourth and second circuits is connected to the other terminal of the voltage source. The third resistor has a resistance value sufficiently great so that the differential voltage between the junction between the first and second circuits and the junction between the third and fourth circuits depends on the source voltage. The differential switching circuit is adapted to change its condition in accordance with the differential voltage between the junction between the first and second circuits and the junction between the third and fourth circuits. The switching circuit has a terminal for outputting the condition thereof. The indicator element is connected to the output terminal to indicate the condition of the differential switching circuit.

10 Claims, 6 Drawing Figures

DEVICE FOR CHECKING A D.C. SOURCE VOLTAGE RELATIVE TO A PREDETERMINED VALUE

BACKGROUND OF THE INVENTION

1. Field of the Invention

This invention relates to a voltage testing circuit, and more particularly to such a circuit which uses an indicator element such as a lamp or light-emitting diode or the like to give a voltage indication.

2. Description of the Prior Art

In a portable instrument using a battery as the voltage source, it must be known whether or not the voltage supply battery has a normal voltage in order to ensure normal operation of electric circuits or the like used therein. This has often been accomplished by using an ammeter. Such method has proved to be disadvantageous in that the pointer in the ammeter is sometimes difficult to see and that the ammeter is too bulky to incorporate it in a limited space such as a camera or the like. There is another method which employs a lamp, a light-emitting diode or the like adapted to turn on to indicate the normal or abnormal condition of the voltage supply battery. This latter method is highly preferable because of its simplicity and visual advantage, and often resorts to the combination of a single transistor and a voltage divider provided by resistors, the lamp or the like being turned on or off in accordance with the comparison between the base-emitter voltage $V_{BE}$ of the transistor and the source voltage. However, in such arrangements the indication is readily affected by temperature variations or irregularities in the transistor's base-emitting voltage $V_{BE}$ and the emitter ground current amplification factor $h_{FE}$. Thus, the latter method has been very unsatisfactory in terms of temperature characteristics and accuracy.

SUMMARY OF THE INVENTION

We have conceived and contribute by the present invention a voltage testing circuit of the above-described type which uses an indicator element such as a lamp or a light-emitting diode and by which we are able to improve both temperature characteristics and detection accuracy.

According to one aspect of the present invention, we employ a bridge circuit which, as seen in FIG. 8 of U.S. Pat. No. 2,482,980, comprises resistors for the first and third branches, a diode group for the second branch, and a serial connection of a resistor and a diode group for the fourth branch; but which, conversely to the teaching of said U.S. patent (i.e., realization of a stable constant voltage source), provides a sufficiently great resistance of the resistor serially inserted in the fourth branch so that the output voltage of the bridge circuit is variable in dependence of the source voltage, and the variation is detected.

There has thus been outlined rather broadly, the more important features of the invention in order that the detailed description thereof that follows may be better understood, and in order that the present contribution to the art may be better appreciated. There are, of course, additional features of the invention that will be described hereinafter and which will form the subject of the claims appended hereto. Those skilled in the art will appreciate that the conception upon which this disclosure is based may readily be utilized as a basis for the designing of other structures for carrying out the several purposes of the invention. It is important, therefore, that the claims be regarded as including such equivalent constructions as do not depart from the spirit and scope of the invention.

BRIEF DESCRIPTION OF THE DRAWINGS

Specific embodiments of the invention have been chosen for purposes of illustration and description, and are shown in the accompanying drawings forming a part of the specification wherein.

DESCRIPTION OF THE PREFERRED EMBODIMENTS

Figure 1:
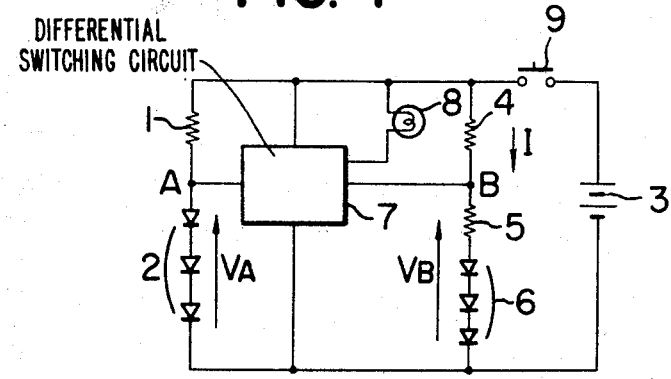
FIG. 1 is a circuit diagram showing an embodiment of the present invention.

FIG. 1 diagrammatically illustrates the circuit according to a first embodiment of the present invention. A fixed resistor 1 is connected in series with diodes 2 with respect to a voltage supply battery 3. Fixed resistors 4 and 5 are connected in series with diodes 6 with respect to the voltage supply battery 3. A differential switching circuit 7 has two input terminals respectively connected to the junction A between the fixed resistor 1 and the diodes 2 and the junction B between the fixed resistors 4 and 5, so as to cut off a flow of current to a lamp 8 connected between the output terminal of the differential switching circuit and the battery 3, when the voltage $V_A$ at the junction A exceeds the voltage $V_B$ at the junction B, and to permit a flow of current to the lamp 8 when the voltage $V_A$ is lower than the voltage $V_b$. Thus, in the present embodiment, there is provided a bridge circuit which has the fixed resistor 1 as the first branch, the diodes 2 as the second branch, the fixed resistor 4 as the third branch, and the serial connection of the fixed resistor 5 and the diodes 6 as the fourth branch, and the voltage $V_A$ at the junction A between the first and second branches of the bridge circuit and the voltage $V_B$ at the junction B between the third and fourth branches provide inputs to the differential switching circuit 7 such that the lamp 8 is turned on or off in accordance with the difference between the voltage $V_A$ and the voltage $V_B$. A push button switch 9 is provided which may be depressed to permit a current supply to the above-described various circuits for the purpose of testing the voltage across the voltage supply battery 3.

Operation of the present embodiment will now be described.

When the push button switch 9 is depressed, as described, a current is supplied to the bridge circuit to produce voltages $V_A$ and $V_B$ at the junctions A and B, respectively. The voltage $V_A$ is expressed as:

$$V_A = 3 \frac{kT}{q} l_n \frac{E - V_A}{R_1 \cdot I_{S_1}} \tag{1}$$

where $k$ is Boltzmann's constant, T is the absolute temperature, $q$ is the primary quantity of electric charge, E is the voltage across the battery 3, $R_1$ is the resistance value of the fixed resistor 1, and $I_S1$ is the reverse saturation current of the diodes 2.

Figure 2:
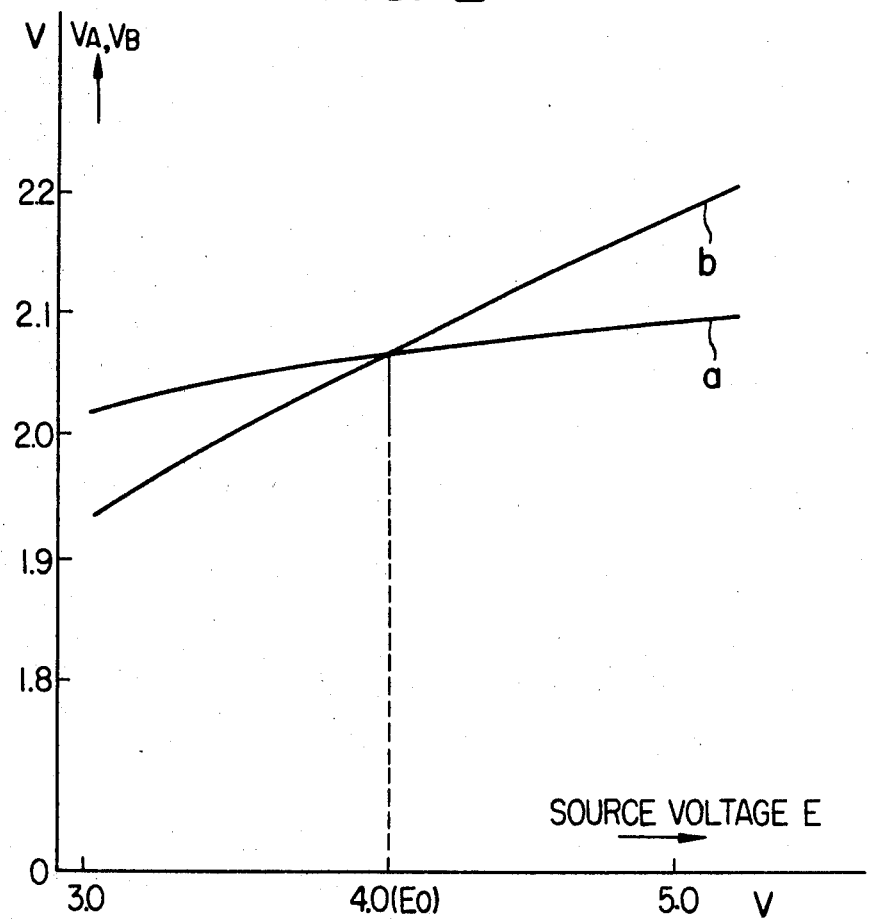
FIG. 2 is a graph illustrating the characteristic of the circuit according to the present invention.

Equation (1) cannot analytically be solved, but in the present embodiment, for example, the voltage $V_A$ will be varied with respect to the source voltage E as indicated by curve a in FIG. 2, if numerical calculation is carried out on the assumption that $R1 = 10k\Omega$ and $I_S1 = 0.5 \times 10^{-15}A$. On the other hand, the voltage $V_B$ is expressed as:

$$V_b = E - I \cdot R4 \ldots \qquad (2)$$

where $I = (E - 3kT/q \, l_n \, I/I_S2) / (R4 + R5)$, R4 is the resistance value of the fixed resistor 4, R5 is the resistance value of the fixed resistor 5, $I_S2$ is the reverse saturation current of the diodes 6, and I is the current flowing through the fixed resistor 4.

Again, with equation (2), in the present embodiment, for example, the voltage $V_B$ will be varied with respect to the source voltge E as indicated by curve b in FIG. 2, if numerical calculation is carried out on the assumption that $R4 = 40k\Omega$, $R5 = 4.25k\Omega$ and $I_S2 = 2 \times 10^{-15}A$. As will be seen from FIG. 2, $V_A$ and $V_B$ equal each other for a certain source voltage $E_O$ ($E_O = 4.OV$) and $V_A < V_B$ when the source voltage E exceeds $E_O$, and $V_A < V_B$ when the source voltage E is lower then $E_O$. The differential switching circuit 7, as previously mentioned, turns on the lamp 8 when $V_A < V_B$, and turns off the lamp 8 when $V_A > V_B$ and thus, the lamp 8 is turned on or off in accordance with the magnitude of the source voltage E, that is, the lamp 8 is turned on when $E > E_O$ and turned off when $E < E_O$, whereby the condition of the source voltage may be checked.

The forward voltage of the diodes presents a temperature variation of the order of $-2mV/C$ per diode, but if the number of diodes 2 and the number of diodes 6 are equal, the temperature variations will appear as substantially identical temperature variations of $V_A$ and $V_B$ and thus, these temperature variations will be offset by each other and will never appear as the temperature variations of the outputs.

In order to provide a characteristic as shown in FIG. 2, the forward voltage of the diodes 6 must be less than the forward voltage of the diodes 2, and this may be accomplished by setting the resistance value of the fixed resistor 4 to a value greater than that of the fixed resistor 1 or selecting the diodes 2 and 6 such that $I_S2$ is greater than $I_S1$, or by adopting both techniques.

Also, if one of the fixed resistors 1, 4 and 5 is made adjustable, $E_O$ may of course be set as desired.

Figure 3:
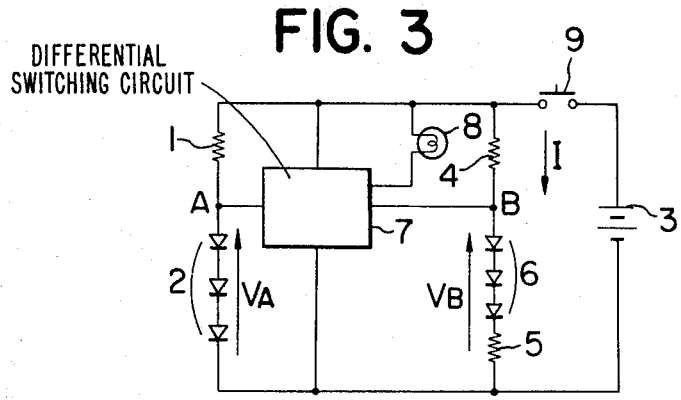
FIG. 3 is a circuit diagram showing another embodiment of the present invention.

FIG. 3 illustrates a second embodiment of the present invention.

This embodiment is entirely identical in operation to the first embodiment, with the only exception that the connection between the fixed resistor 5 and the diodes 6 in the bridge circuit is opposite to that in the first embodiment.

In these embodiments, a lamp is employed for the indication, but it may be replaced by a light-emitting diode or other indicator element.

Figure 6:
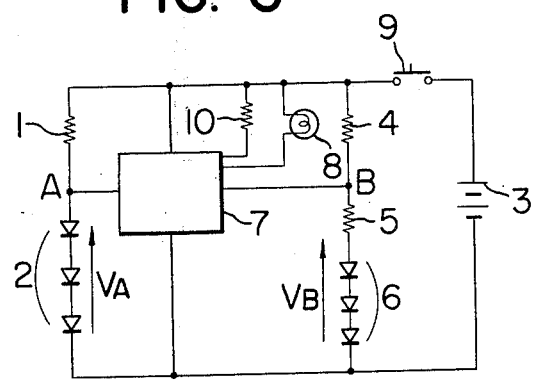
FIG. 6 is a circuit diagram showing still another embodiment of the present invention.

In the circuits described above, the current consumed by the indicator lamp 8 is much greater than the current consumed by the other circuits and, when the internal resistance of the power supply battery 3 is relatively great, there will occur oscillations which will affect the stability and detection accuracy of the circuit as a whole. A third embodiment which is an improvement over the above-described embodiments is shown in FIG. 6. This embodiment is substantially identical to the embodiment of FIG. 1 with the exception that the differential switching circuit 7 is provided with an additional output terminal to one end of which is connected a fixed resistor 10 the other end of which is connected to the battery 3, as shown. This additional output terminal is opposite in phase from the output terminal to which the lamp 8 is connected. More specifically, when $V_A < V_B$ and the lamp 8 is turned on, the current to the resistor 10 is cut off, and when $V_A > V_B$ and the lamp 8 is turned off, the current is permitted to flow to the resistor 10. The resistor 10 has a resistance value substantially equal to that of the lamp 8.

The occurrence of the aforementioned oscillations is attributed to the fact that the current consumption so greatly differs between the ON condition and the OFF condition of the lamp 8 that the terminal voltage of the power supply battery is varied and such variation is fed back to the input. However, the oscillations may be prevented by the arrangement shown in FIG. 6 wherein little or no variation occurs in the current consumption between the ON condition and the OFF condition of the lamp 8.

It should be noted here that U.S. Pat. No. 2,482,980 is directed to the realization of a stable constant voltage source, and this is entirely different from the purpose of the present invention.

When the circuit shown in FIG. 8 of said United States patent and the circuit shown in FIG. 1 of the present invention are compared, it will be seen that the present invention differs from the disclosure of said United States patent in tht it has a differential switching circuit and an indicator element. Further, those skilled in the art will appreciate that the condition of the resistance value R5 of the resistor 5 in FIG. 1 of the present specification, differs from that disclosed in said United States patent.

Comparison will now be made between a circuit in which the differential switching circuit and the indicator element are eliminated from the FIG. 1 circuit of the present invention and the circuit shown in FIG. 8 of said United States patent.

Figure 4:
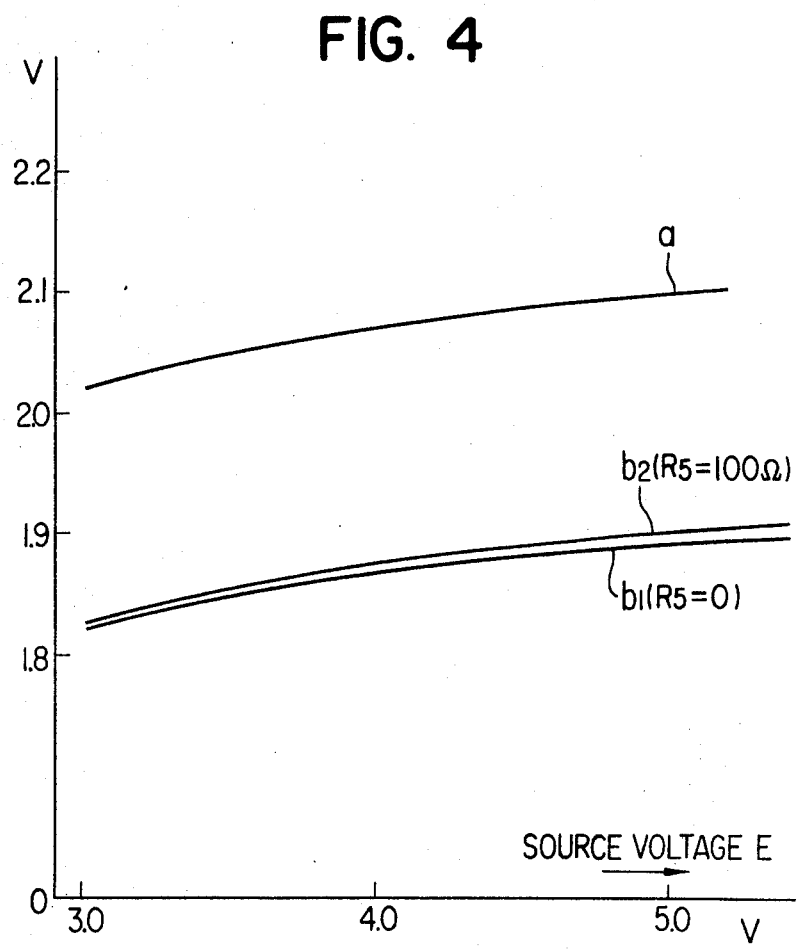
FIGS. 4 and 5 are graphs illustrating the characteristics of circuits different in circuit condition from the circuit of the present invention.
Figure 5:
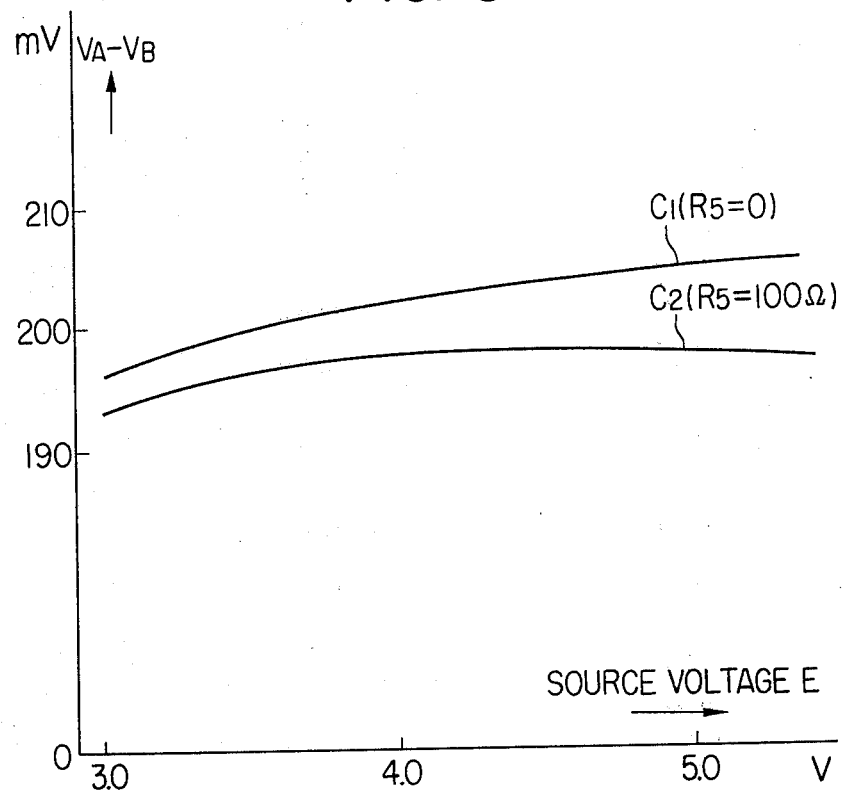

In the circuit which eliminates the differential switching circuit and the indicator element, when numerical calculation is carried out with only the resistance value R5 of the resistor 5 being $0\Omega$ and $100\Omega$ and with all the other circuit constants being predetermined, then the result will be such as shown in the graph of FIG. 4, wherein curve a represents $V_A$, curve b1 represents $V_B$ when $R5 = 0\Omega$, and curve b2 represents $V_B$ when $R5 = 100\Omega$. If the value of $V_A - V_B$ is graphically depicted with respect to the source voltage E, the graph of FIG. 5 will be obtained in which c1 represents $V_A - V_B$ when $R5 = 0\Omega$ and c2 represents $V_A - V_B$ when $R5 = 100\Omega$. Thus, the realization of the stable constant voltage source intended by said United States patent requires that R5 be a low resistance of the order of $100\Omega$ at best, or in other words, a low resistance of the order which will cause a voltage drop of 2 to 3 mv per diode in use, and this is different from the present invention which permits the use of a resistance of the order of 4 to 5 $k\Omega$.

According to the present invention constructed as described above, a voltage checker or testing circuit with reduced temperature variation and which is stable and superior in detection accuracy may be provided by the use of a visually advantageous indicator element such as a lamp or a light-emitting diode.

We believe that the construction and operation of our novel circuit will now be understood and that the advantages thereof will be fully appreciated by those persons skilled in the art.

We claim:

1. A Device for checking and indicating the voltage of a D.C. source relative to a predetermined value, comprising:
   a. a bridge circuit including:
      a first circuit comprising a first resistor;
      a second circuit comprising a first diode means and connected to said first circuit;
      a third circuit comprising a second resistor and connected to said first circuit, the junction between said third and first circuits being connected to one of the terminals of said D.C. source; and
      a fourth circuit comprising a serial connection of second diode means and a third resistor, one end of said fourth circuit being connected to said third circuit and the other end being connected to said second circuit, the junction between said fourth and second circuits being connected to the other terminal of said D.C. source, the resistance value of said third resistor being sufficiently great so that the differential voltage between the junction of said first and second circuits and the junction of said third and fourth circuits varies in dependence on the voltage of said D.C. source;
   b. a differential switching circuit connected between the junction between said first and second circuits and the junction between said third and fourth circuits to change its condition in accordance with the differential voltage between said two junctions, said differential switching circuit having an output terminal for representing the condition thereof; and
   c. an indicator element connected to said output terminal for indicating the condition of said differential switching circuit to provide an indication of the voltage of said D.C. source relative to said predetermined value.

2. A device according to claim 1, wherein said output terminal of said differential switching circuit becomes conductive when the voltage at the junction of said first and second circuits is less than the voltage at the junction of said third and fourth circuits, and becomes non-conductive when the voltage at the junction of said first and second circuits is greater than the voltage at the junction of said third and fourth circuits.

3. A device according to claim 1, wherein one end of said second diode means and one end of said third resistor are connected together, and the other ends of said second diode means and said third resistor are connected to said second and said third circuit, respectively.

4. A device according to claim 1, wherein one end of said second diode means and one end of said third resistor are connected together, and the other ends of said second diode means and said third resistor are connected to said third and said second circuit, respectively.

5. A device according to claim 1, wherein the forward voltage of said first diode means is set to a value greater than the forward voltage of said second diode means.

6. A device according to claim 1, wherein said first, second and third resistors are all fixed resistors.

7. A device according to claim 1, wherein at least one of said first, second and third resistors is adjustable.

8. A device according to claim 1, wherein said first diode means comprises a group of diodes equal in number to a group of diodes comprising said second diode means.

9. A device according to claim 1, wherein said indicator element is a lamp.

10. A device according to claim 1, wherein said indicator element is a light-emitting diode.

* * * * *

UNITED STATES PATENT AND TRADEMARK OFFICE
CERTIFICATE OF CORRECTION

PATENT NO. : 3,970,933
DATED : July 20, 1976
INVENTOR(S) : ICHIRO HAMAGUCHI, et al.

It is certified that error appears in the above-identified patent and that said Letters Patent are hereby corrected as shown below:

First page, Bibliographic Data, below INID Code "[21]", insert:

-- [30]     Foreign Application Priority Data

January 28, 1974   Japan ............ 49/10890 --

Column 4, line 34, change "tht" to -- that --.

Signed and Sealed this

Twenty-eighth Day of December 1976

[SEAL]

Attest:

RUTH C. MASON
Attesting Officer

C. MARSHALL DANN
Commissioner of Patents and Trademarks